(12) United States Patent
Moriconi et al.

(10) Patent No.: US 6,489,758 B2
(45) Date of Patent: Dec. 3, 2002

(54) BOOTSTRAP CIRCUIT IN A DC/DC STATIC CONVERTER HAVING CIRCUITRY FOR AVOIDING BOOTSTRAP CAPACITOR DISCHARGE

(75) Inventors: Ugo Moriconi, Dalmine (IT); Claudio Adragna, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/912,232

(22) Filed: Jul. 24, 2001

(65) Prior Publication Data

US 2002/0036487 A1 Mar. 28, 2002

(30) Foreign Application Priority Data

Jul. 25, 2000 (IT) .......................................... MI00A1692

(51) Int. Cl.[7] .............................. G05F 1/44; G05F 1/56
(52) U.S. Cl. ....................... 323/288; 323/284; 323/224
(58) Field of Search ................................. 323/224, 225, 323/288, 284, 285, 286

(56) References Cited

U.S. PATENT DOCUMENTS

| | | | | |
|---|---|---|---|---|
| 5,583,290 A | * | 12/1996 | Lewis | 73/514.18 |
| 5,627,460 A | * | 5/1997 | Bazinet et al. | 323/288 |
| 5,959,442 A | * | 9/1999 | Hallberg et al. | 323/282 |
| 6,160,389 A | * | 12/2000 | Watts | 323/282 |
| 6,201,717 B1 | * | 3/2001 | Grant | 363/60 |

\* cited by examiner

Primary Examiner—Bao Q. Vu
(74) Attorney, Agent, or Firm—Lisa K. Jorgenson; Stephen Bongini; Fleit, Kain, Gibbons, Gutman & Bongini P.L.

(57) ABSTRACT

Disclosed is a bootstrap circuit in DC/DC static converters having the characteristic of comprising a fixed frequency signal, a recharge circuit of a capacitor and current generator means, said generator means controlled so as to emit current pulses, in synchrony with said fixed frequency signal, of a predetermined duration, every time that charge accumulated by said capacitor goes below a predetermined level.

16 Claims, 3 Drawing Sheets

BOOTSTRAP CIRCUIT IN A DC/DC STATIC CONVERTER HAVING CIRCUITRY FOR AVOIDING BOOTSTRAP CAPACITOR DISCHARGE

BACKGROUND OF THE INVENTION

1. Field of the Invention

The present invention refers to a bootstrap circuit in DC/DC static converters, particularly in DC/DC static converters in step-down configuration comprising such bootstrap circuit. The present invention finds particular application in static converters for circuits realized in monolithic form.

2. Description of Related Art

DC/DC static converters are widely used in power supplies, actuator systems, displays, signal processing systems etc. and are based on well-known technologies in which a magnetic means, such as a transformer or an inductance, is driven by at least one power switch. Said switches are controlled by a Pulse Width Modulation (PWM) system commutating at a certain frequency set by a system timing signal.

In the field of static converters there are various typologies, such as step-down converters, also known as "buck" converters in which the regulated output voltage is less than the input voltage, step-up converters, also known as "boost" converters in which the regulated output voltage is greater than the input voltage and the converters called "buck-boost" in which the regulated output voltage has an inverse sign compared to the input voltage.

In the configuration of the step-down converters, illustrated in FIG. 1, the power switch is represented by an N-channel DMOS transistor in high-side configuration that is a configuration in which the source terminal is floating and the magnetic means is represented by an inductance L. The source voltage of said DMOS can vary, therefore, between Vin, that is the input voltage of the converter when the DMOS is on and forces current in said inductance L, and −Vd, which is the voltage drop on a recirculation diode when the DMOS is off and the current stored in L flows through said diode. A graph is shown in FIG. 3 representing the circuit of FIG. 1 when the charge connected to it is at the maximum value.

As is well known to a technician in the sector, in order that an N-channel DMOS transistor is well on, that is its channel resistance Rds(ON) is minimized, it is necessary for the voltage difference between the gate terminal and the source terminal of said DMOS to be greater than about 10V. Nevertheless when the DMOS is well on, that is when it operates in deep ohmic region, the voltage of the source terminal is about equal to the input voltage, apart from the voltage drop due to the resistance of the DMOS itself. This implies the necessity to have a voltage available which exceeds the input voltage that is wanted to make the DMOS work in deep ohmic region. A widely diffused technique to obtain this boosting is the so-called bootstrap technique.

Nevertheless, also in circuit configurations comprising bootstrap means, such as capacitors, inductors and recirculation diodes, there is the disadvantage that the DMOS transistor is driven efficiently and its Rds(ON) is minimum while said bootstrap means guarantee a sufficiently higher voltage than the input voltage.

The limit of the above mentioned bootstrap circuits is that the DMOS cannot be kept on for an indefinitely long time and above all a minimum time has to be guaranteed during which the magnetic means, that is the inductor, degausses. In this period of time the potential of the source terminal must therefore be sufficiently near to zero so that the capacitor recharges.

The need to recharge the capacitor is a pressing problem from the technological point of view when the DC/DC converter functions with loads of modest value because one of the following disadvantages can occur:

a) having a load of modest value the DMOS "on" time is very short and also the recirculation diode recharge time is short as is shown in FIG. 4. This means that if the load is sufficiently small the recirculation time of the diode can become so short that it does not enable the capacitor to recharge.

b) the DMOS must be on for a minimum time in function of the delays of the control circuit. When the load is very low and requires the DMOS to be on for a shorter time than the minimum time, not being able to satisfy such condition, in the short time there is an excess of energy carried on the load with the consequent slight increase of the output voltage. The control loop in feedback reacts and several commutation cycles are skipped so as to bring the output voltage to the regulation value and re-establish the correct energy balance. In this case, therefore, the time available for recharging the bootstrap capacitor diminishes even further.

c) if the input and output voltages are relatively high (both exceeding around ten Volts) and near each other the voltage forced in the inductor during the time in which the DMOS is on can be so small that the demagnetization of the inductor comes about at the expense of the energy of the capacitance of the source terminal. When this occurs the voltage of the source terminal remains several Volts above zero and the recirculation diode is not switched on, as described in FIG. 5.

d) during the DC/DC converter turning off phase if the output voltage is relatively high (exceeding around ten Volts) the input voltage will diminish very slowly and when it approaches the output voltage it falls back into condition (c). The output voltage does not go to zero monotonically but oscillating.

The result of the previously described phenomena is that the capacitor progressively discharges and as soon as its voltage goes below the threshold voltage of the DMOS transistor, said transistor cannot be switched on again and the converter will be blocked. According to the value of the input and output voltage and of the values of the components constituting the converter, intermittent functioning or a definitive block of the same converter will be obtained.

The U.S. Pat. No. 5,627,460 tells how to use the technique of the so-called "synchronized diode" applied to a DC/DC converter step-down in which the recirculation diode is replaced by an N-channel DMOS in low-side configuration that results being driven in push-pull in respect of the main DMOS. Such a solution is not applicable to the standard typology of the circuits because the latter provides for only one recirculation diode and not two diodes synchronized in push-pull.

The International Rectifier in one of its applicative notes (DT94-1A "Keeping the bootstrap capacitor charged in buck converts") relating to its device IR2125, suggests to apply a resistor and a Zener diode. This technique is effective when the input voltage is quite higher than the output voltage and therefore not applicable in case (c). In addition if the input voltage has a wide variation interval, to be able to guarantee sufficient current to the minimum input voltage a relatively low resistive value is necessary which leads, when the input voltage is high, to high power dissipation in the resistance and in the Zener.

Other known solutions resort to magnetic means but have the disadvantage that when the load of the converter has a modest value the magnetic energy is also very low, comparable to or lower than that dissipated by the effect of the not-ideal coupling between the windings with consequent efficiency losses.

SUMMARY OF THE INVENTION

In view of the state of the technique described, the object of the present invention is to realize a circuit suitable for avoiding the discharging of the bootstrap capacitor so as to permit more effective driving of the DMOS in high-side configuration.

In accordance with the present invention, said object is reached by means of a bootstrap circuit in DC/DC static converters characterized in that it comprises a fixed frequency signal, a recharge circuit of a capacitor and current generator means, said generator means controlled so as to emit current pulses, in synchrony with said fixed frequency signal, of a predetermined duration, every time the charge accumulated by said capacitor goes below a predetermined level.

In addition said object is also reached by means of a bootstrap circuit in DC/DC static converters, characterized in that it comprises a comparator suitable for comparing the charge degree of said capacitor with a predetermined value so as to compensate the discharge of said capacitor.

Thanks to the present invention it is possible to realize a circuit capable of eliminating the problems connected to the bootstrap technique.

In addition it is possible to realize a circuit that permits the turning on of a DMOS high-side for an undetermined time.

The present invention finds application also in other typologies of static converters such as the "buck-boost", the "flyback", the double switch "forward", the half bridge and the full bridge, that is circuits used for the control of motors.

In addition the present invention finds particular application in monolithic static converters, that is those converters in which both the control part and the power switch are integrated into the same chip.

BRIEF DESCRIPTION OF THE DRAWINGS

The characteristics and the advantages of the present invention will appear evident from the following detailed description of an embodiment thereof, illustrated as nonlimiting example in the enclosed drawings, in which.

DETAILED DESCRIPTION OF PREFERRED EMBODIMENTS

Figure 1:
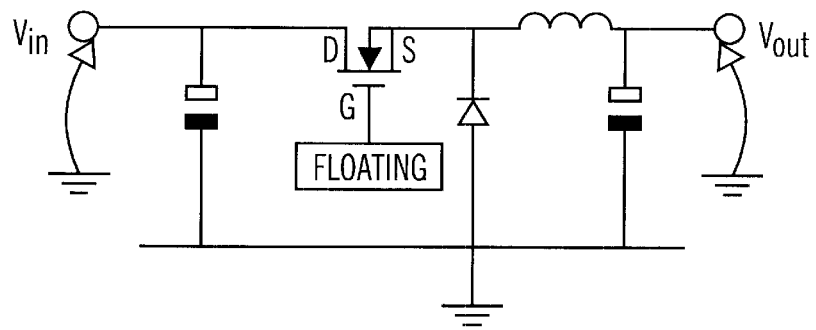
FIG. 1 shows a configuration of DC/DC static converter in buck configuration with power switch in high-side configuration according to the known technique.
Figure 2:
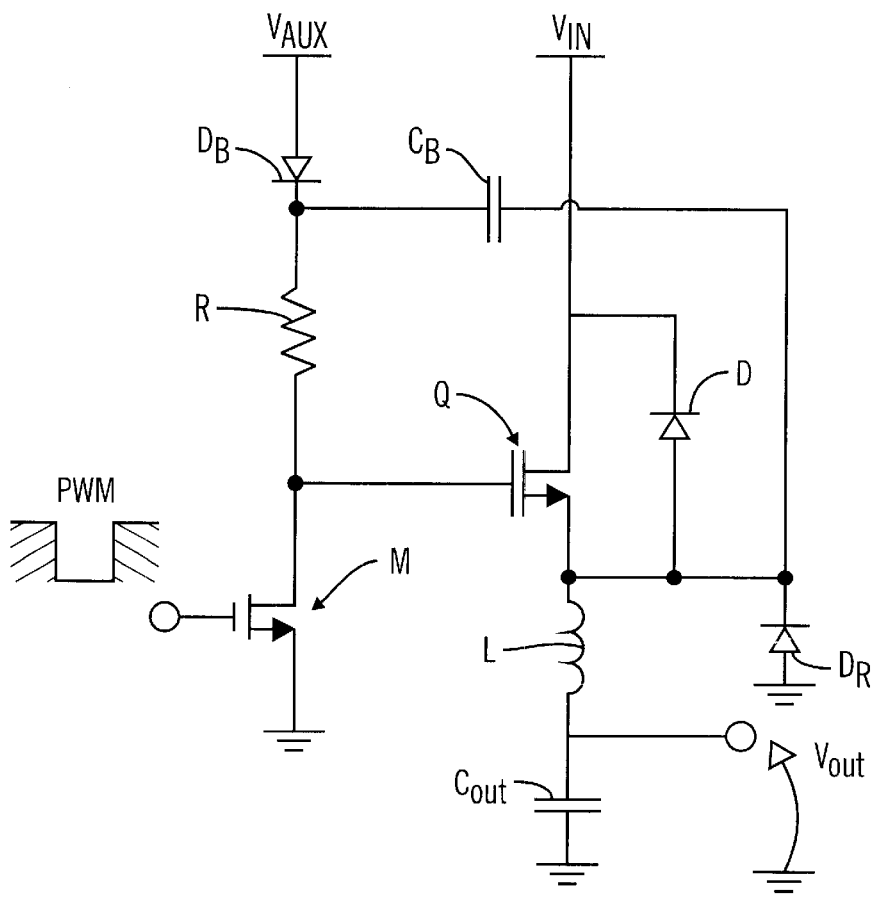
FIG. 2 shows schematically the bootstrap technique applied to a DMOS high-side of a DC/DC static converter in buck configuration, according to the known technique.
Figure 3:
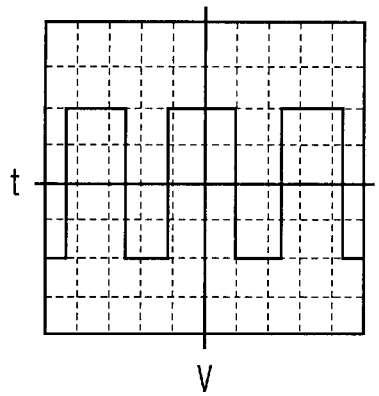
FIG. 3 shows a typical waveform of the circuit in FIG. 1 in the case of maximum load.
Figure 4:
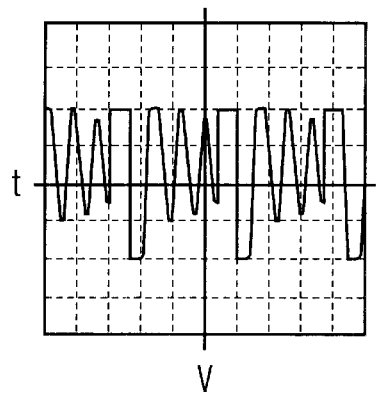
FIG. 4 shows a typical waveform of the circuit in FIG. 1 in the case of light load.
Figure 5:
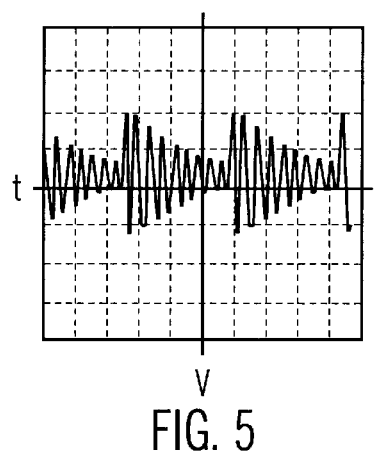
FIG. 5 shows a typical waveform of the circuit in FIG. 1 in the case of extremely low value.

FIG. 2 shows schematically a circuit using the bootstrap technique applied to a DMOS high-side of a DC/DC static converter in buck configuration, according to the known technique.

According to what is illustrated in said Figure a DMOS type transistor Q can be noted having an internal diode D and its own source terminal connected with an inductance L in turn connected with an output capacitor Cout grounded, and in addition said source terminal is also connected with a cathode terminal of a recirculation diode Dr, said diode Dr, in addition, has its anode terminal connected to ground. The output terminal of the circuit, called Vout, is placed at the leads of the capacitor Cout. The drain terminal of the DMOS Q is connected to a first supply line Vin, while the gate terminal of the DMOS Q has in parallel respectively, the series of a resistance R and of a diode $D_B$, with an M signal transistor of the MOSFET type. The latter has its source terminal connected to ground and the gate terminal acts as input for a PWM type signal, generated with known techniques, such as the combination of a sawtooth generator and a modulating signal through a comparator. The drain terminal of M represents the connection with the DMOS Q.

The resistance R and diode $D_B$ series are arranged so that said R is the connection with the gate terminal of said DMOS Q, and that said diode $D_B$ has the anode connected to a second supply line Vaux, with Vaux>Vin, and that the cathode connected with said R is also connected with a plate of a capacitor $C_B$.

Said $C_B$ has the other plate connected with the source terminal of said DMOS. $C_B$ is the element suitable for storing the charge, which in combination with said second supply, permits the circuit shown in the Figure to keep the DMOS Q well on and therefore to minimize the resistance Rds(ON).

In fact when there is a high signal at the gate terminal of M, with R suitably sized, we are in a situation in which M is on and Q is off and therefore the voltage at the leads of the capacitor $C_B$ is: $V_{CB}$=Vaux−$V_{DB}$ with $V_{DB}$ being the voltage drop at the leads of the diode $D_B$ when forward biased.

Vice versa when there is a low signal at the gate terminal of M, the voltage on the gate terminal of the DMOS Q starts to increase because the diode $D_B$ charges the intrinsic capacitances $C_{GD}$ and $C_{GS}$ of the DMOS Q. In addition $V_{CB}$ does not vary instantaneously because the current that flows in the mesh is not infinite and finally the diode $D_B$ goes off as point A is increased in voltage in the same quantity as the source terminal of the DMOS Q. We are therefore in a situation in which $C_B$ is isolated (current does not flow in the mesh) and therefore said $C_B$ acts like a battery giving origin to a difference in potential between gate and source of Q equal to: $V_{GS}$=$V_{CB}$. The voltage at the gate terminal of Q rises to a level equal to: $V_G$=$V_{CB}$+Vin=Vin+Vaux−$V_{DB}$.

Figure 6:
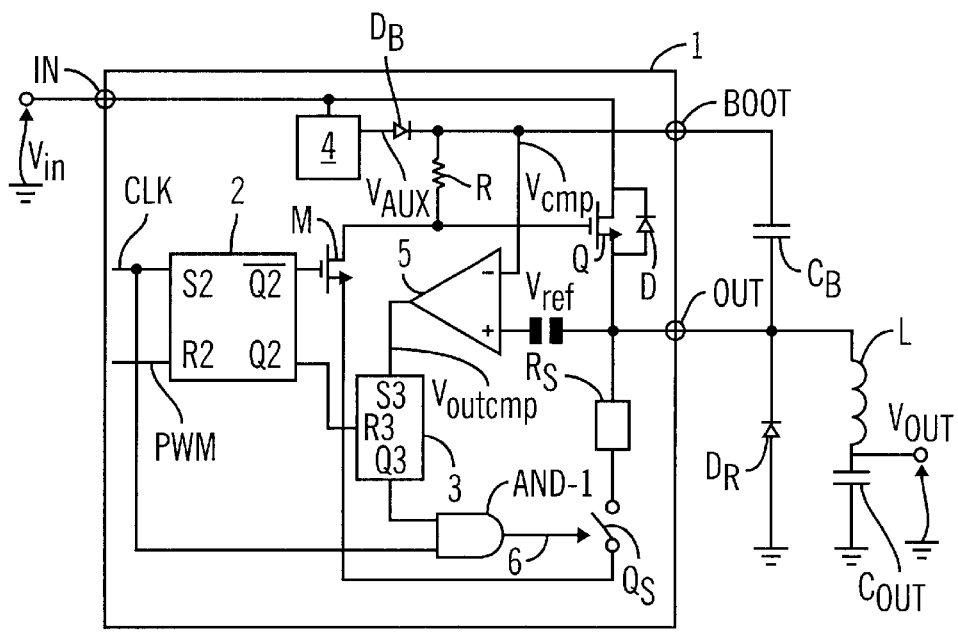
FIG. 6 shows a first monolithic embodiment of the circuit according to the present invention.

FIG. 6 shows a first monolithic embodiment of the circuit according to the present invention in which it can be noted that the capacitor $C_B$ and the charge inductance L with the output capacitor Cout are outside a casing 1, including among others several devices already described in the sphere of FIG. 2, such as the bootstrap diode $D_B$ and inside D, the resistance R, the DMOS Q transistor and the signal M transistor.

In particular the MOS M signal transistor has the gate terminal connected to a latch device 2, the drain terminal connected with the series of the resistance R and of the diode $D_B$ and the source terminal connected with a switch $Q_S$. The series composed of the resistance R and of the diode $D_B$ is connected to a device 4 that acts as voltage regulator.

Said device 4 is in turn connected with the supply line Vin by means of an input pin, called IN, and said device 4 has the task of creating an auxiliary voltage Vaux, with Vaux>Vin, capable of supplying the necessary voltage for DMOS Q to be well on and its resistance Rds(ON) to be minimized. The device 4 thus realizes the bootstrap circuit with the capacity of bootstrap.

The DMOS Q has the gate terminal connected con the drain terminal of M, has the drain terminal connected with the supply line Vin, by means of said input pin IN, and has the source terminal with the series of a resistance $R_S$ and a switch $Q_S$.

The capacitance $C_B$ is connected to said voltage Vaux by means of an output pin, called BOOT, and is connected to an inductance L, and an output capacitor Cout, in turn grounded. The inductance L is placed on an output pin, called OUT, to which is connected the source terminal of said DMOS Q , the series of the resistance $R_S$ and of the switch $Q_S$ and a reference voltage generator Vref.

On said auxiliary supply line Vaux there is also the connection of an inverting input Vcmp of a comparator 5. Said comparator has on a non-inverting input the reference voltage Vref, generated by means of a reference voltage generator with constant value, value defined during planning.

The comparator 5 has an output Voutcmp which results to be a first input S3 of a latch device 3. Said latch device 3 has an output Q3 that results to be an input of a logic gate AND, called AND-1.

The latch device 3 has a second input R3 that results to be connected with an output Q2 of a further latch device 2.

The logic gate AND-1 also has in input fixed frequency signal, for example a Clk signal, and said logic gate AND-1 places in output a command signal 6 suitable for commanding the closing/opening of said switch $Q_S$.

The latch device 2 has on a first input S2 the fixed frequency signal Clk, generated for example by an oscillator (not shown in the Figure), and on a second input R2 a pulse width modulation signal called PWM, generated by means of known techniques, such as, the comparison by means of a comparator of a sawtooth signal and a modulating signal.

Said latch 2 has a first output pin Q2-negated connected to the gate terminal of said M signal transistor, and the second output pin Q2 connected to the first input pin R3 of the second latch device 3.

As previously described in FIG. 2 the capacitor $C_B$ is subject to parasitisms that reduce the quantity of charge stored between its plates and therefore the voltage value degrades. To prevent the level of the voltage from falling below a certain threshold a comparison is carried out by means of said comparator 5 between the reference voltage Vref and the Vcmp present at the leads of said capacitor $C_B$. In function of the value of this comparison, in particular if it results that Vref is greater than Vcmp, a high value is placed on the output line Vcmpout that sets the input S3 of the latch 3.

Contemporarily when the latch 2 places a low value on the output Q2, that is MOS M on because the gate of M is commanded by Q2-negated and therefore DMOS Q off, and in addition when the input signal Clk is high the latch 3 places a high value in output on the input Q3.

The signals Q3 and Clk, both high, are the inputs of said logic gate AND-1 that places a high value on the output line. In this manner switch $Q_S$ is commanded to close.

Switch $Q_S$ is preferably constituted of a MOS transistor or a bipolar transistor.

The closing of the switch $Q_S$ entails the regeneration of the charge contained in $C_B$ because $Q_S$ realizes a conductive charge path for said capacitor $C_B$.

The resistance $R_S$ is a limitation resistance and serves to limit the charge current of $C_B$.

Therefore $Q_S$ is commanded with the pulses of the Clk signal ( pulses that last a few hundreds of nano-seconds) that are generated during the trailing ramp of the saw-tooth signal generated by the local oscillator (not shown in the Figure) so as to ensure the absence of contemporary conduction with the DMOS Q, because the latter is kept off during said trailing ramp of said saw-tooth signal.

Thus the comparator 5 controls the voltage present at the leads of $C_B$ and sets the latch 3 the moment this voltage becomes lower than the reference value Vref. Therefore the switch $Q_S$ is turned on only during the Clk pulse.

Figure 7:
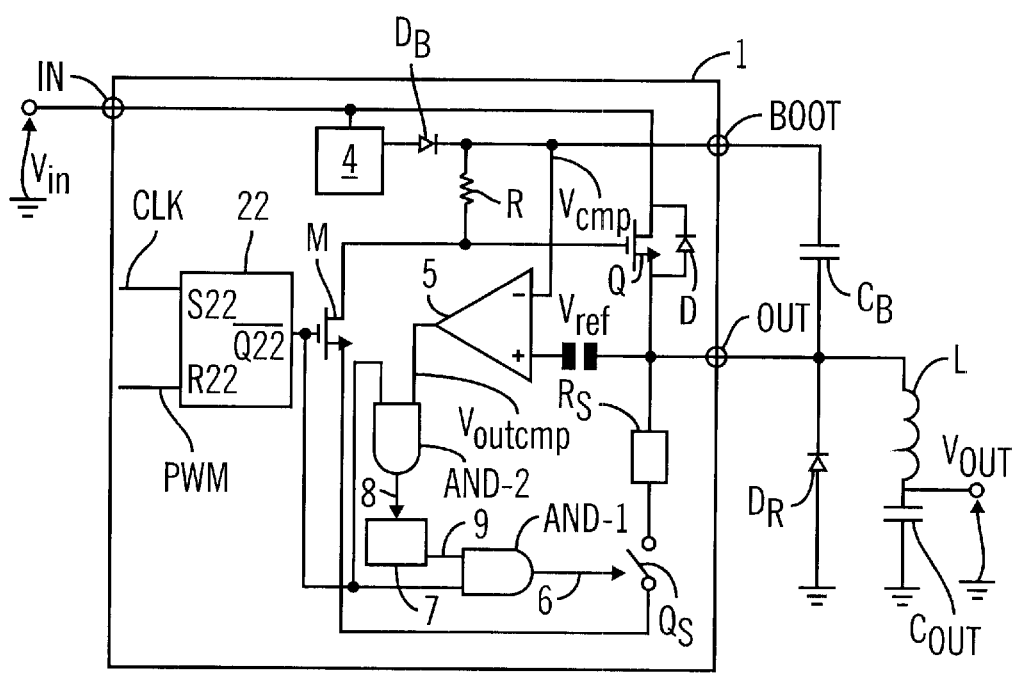
FIG. 7 shows a first monolithic embodiment of the circuit according to the present invention.

An alternative form of control of the switch $Q_S$ is shown in FIG. 7, in which it can be seen that the output signal Voutcmp of the comparator 5 results to be the input of a further logic gate type AND, called AND-2.

It can also be noted that a latch 22 in this embodiment possesses only one output Q22-negated connected to the gate terminal of the transistor M, to the logic gate AND-1 and in addition is connected to said logic gate AND-2 and in addition possesses two inputs S22 and R22, to which are respectively connected said fixed frequency signal Clk and said pulse width modulation signal PWM.

The logic gate AND-2 has an output line 8 connected with a time block 7. Said time block 7 has an output line 9 connected to said logic gate AND-1.

When the comparator 5 detects voltage present on the line Vcmp that is lower than the reference voltage Vref, that is the voltage presents at the leads of $C_B$ lower than the reference voltage Vcmp, the comparator 5 places a high value on the output Voutcmp and contemporarily when the output Q2-negated of the latch 22 is high and the logic gate AND-2 has two high inputs such to place a high value on the output 8. Said value present on the line 8 activates the time block 7 that places a high value on the output 9. In this manner there are two high values on the input of the logic gate AND-1 such to place a high value on the output 6 such to close the switch Qs.

Said time block 7 keeps a high value on its own output 9 for a predetermined time τ, for example τ=1 μsec. During this time window τ the switch $Q_S$ is closed.

The switch $Q_S$ preferable consists of a MOS transistor or a bipolar transistor.

The closing of the switch $Q_S$ entails the regeneration of the charge contained in $C_B$ because $Q_S$ realizes a conductive charge path for said capacitor $C_B$.

The resistance $R_S$ is a limitation resistance and serves for limiting the charge current of $C_B$.

Thus the switch $Q_S$ is closed on the condition that the transistor DMOS Q is off, that is in the event that the transistor M is on, that is when the output Q22-negated of the latch 22 is high. In addition said switch $Q_S$ is kept in conduction for a predetermined period of time by means of the block 7, but if the DMOS Q is turned on in this time interval $Q_S$ is turned off to avoid crossconduction.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. Bootstrap circuit in DC/DC static converters comprising:
    a fixed frequency signal,
    a recharge circuit of a capacitor,
    current generator means, said generator means controlled so as to emit current pulses, synchronous with said fixed frequency signal, of a predetermined duration, every time the charge accumulated by said capacitor goes below a predetermined level, and
    a comparator suitable for comparing the degree of charge of said capacitor with a predetermined value so as to compensate the discharge of said capacitor,
    wherein the opening/closing of a switch of the current generator means is controlled by the output signal of a first logic gate type and, whose inputs are respectively said fixed frequency signal and the output signal of a first latch, said first latch having as input signal respectively an output signal of said comparator and a first output signal of a second latch, said comparator having as inverting input the voltage present at the leads of said bootstrap capacitor and as non-inverting input said reference voltage, said second latch having as inputs respectively said fixed frequency signal and a pulse width modulation signal and as second output a signal suitable for controlling the turning on/turning off of a signal transistor, in turn capable of controlling the turning on/turning off of a DMOS transistor.

2. Bootstrap circuit in DC/DC static converters comprising:
    a fixed frequency signal,
    a recharge circuit of a capacitor,
    current generator means, said generator means controlled so as to emit current pulses, synchronous with said fixed frequency signal, of a predetermined duration, every time the charge accumulated by said capacitor goes below a predetermined level, and
    a comparator suitable for comparing the degree of charge of said capacitor with a predetermined value so as to compensate the discharge of said capacitor,
    wherein the opening/closing of a switch of the current generator means is controlled by the output signal of a first logic gate type and, whose inputs are respectively an output signal of a third latch and an output signal of a time block, said third latch having as inputs respectively said fixed frequency signal and a pulse width modulation signal, said time block having as input an output signal of a second logic gate type and, having as inputs an output signal of said comparator and the output signal of said third latch, said comparator having as inverting input the voltage presents at the leads of said bootstrap capacitor and as non-inverting input said reference voltage, said third latch capable of controlling the turning on/turning off of a signal transistor, in turn capable of controlling the turning on/turning off of a DMOS transistor.

3. A bootstrap circuit in a DC/DC static converter that transforms an input voltage to a lower output voltage, said converter comprising:
    a first diode having its anode coupled to ground;
    a transistor switch coupled to the input voltage and to the cathode of the first diode;
    drive circuitry for the transistor switch, the drive circuitry being coupled to the transistor switch;
    an output filter including an inductor and a capacitor, the inductor being coupled to the transistor switch and to the first diode;
    a control circuit that receives at least a portion of the output voltage, the control circuit providing a driving signal to the drive circuitry so as to control the duty cycle of the transistor switch in order to maintain the output voltage at a constant level;
    a bootstrap diode having its anode coupled to an auxiliary voltage, which is derived from the input voltage;
    a bootstrap capacitor that stores the auxiliary voltage in order to supply the drive circuitry, one plate of the bootstrap capacitor being coupled to the drive circuitry and the bootstrap diode, and the other plate of the bootstrap capacitor being coupled to the transistor switch; and
    bootstrap capacitor discharge avoidance circuitry, the bootstrap capacitor discharge avoidance circuitry including an auxiliary switch that is coupled to the source of the transistor switch, the auxiliary switch operating to recharge the bootstrap capacitor each time the voltage of the bootstrap capacitor falls below a predetermined value.

4. The bootstrap circuit in a DC/DC static converter according to claim 3, further comprising a load of the converter connected across the capacitor of the output filter.

5. The bootstrap circuit in a DC/DC static converter according to claim 3, wherein the bootstrap capacitor discharge avoidance circuitry further includes a resistor coupled in series with the auxiliary switch.

6. The bootstrap circuit in a DC/DC static converter according to claim 3, wherein the transistor switch is an N-channel MOSFET transistor.

7. The bootstrap circuit in a DC/DC static converter according to claim 3, wherein the transistor switch is a pnp type bipolar transistor.

8. A bootstrap circuit in a DC/DC static converter that transforms an input voltage to a lower output voltage, said converter comprising:
    a first diode having its anode coupled to ground;
    a transistor switch coupled to the input voltage and to the cathode of the first diode;
    a drive circuit for the transistor switch, the drive circuit being coupled to the transistor switch;
    an output filter including an inductor and a capacitor, the inductor being coupled to the transistor switch and to the first diode;
    a bootstrap capacitor that stores an auxiliary voltage, the bootstrap capacitor being coupled between the drive circuit and the transistor switch; and
    an auxiliary switch that is coupled to the bootstrap capacitor, the auxiliary switch operating to recharge the bootstrap capacitor each time the voltage of the bootstrap capacitor falls below a predetermined value.

9. The bootstrap circuit in a DC/DC static converter according to claim 8, wherein the converter does not include a low side switch that is driven in push-pull configuration with respect to the transistor switch.

10. The bootstrap circuit in a DC/DC static converter according to claim 8, further comprising a load of the converter connected across the capacitor of the output filter.

11. The bootstrap circuit in a DC/DC static converter according to claim 8, further comprising a resistor coupled in series with the auxiliary switch.

12. The bootstrap circuit in a DC/DC static converter according to claim 8, wherein the bootstrap capacitor supplies the auxiliary voltage to the drive circuit, one plate of the bootstrap capacitor being connected to the drive circuit and a bootstrap diode, and the other plate of the bootstrap capacitor being connected to the transistor switch.

13. The bootstrap circuit in a DC/DC static converter according to claim 8, wherein the auxiliary voltage is derived from the input voltage.

14. The bootstrap circuit in a DC/DC static converter according to claim 8, wherein the auxiliary switch is also coupled to the source of the transistor switch.

15. The bootstrap circuit in a DC/DC static converter according to claim 8, wherein the transistor switch is an N-channel MOSFET transistor.

16. The bootstrap circuit in a DC/DC static converter according to claim 8, wherein the transistor switch is a pnp type bipolar transistor.

* * * * *